United States Patent
Zampardi et al.

(10) Patent No.: US 9,698,137 B2
(45) Date of Patent: Jul. 4, 2017

(54) ELECTROSTATIC DISCHARGE (ESD) PROTECTION OF CAPACITORS USING LATERAL SURFACE SCHOTTKY DIODES

(71) Applicant: Qorvo US, Inc., Greensboro, NC (US)

(72) Inventors: Peter J. Zampardi, Newbury Park, CA (US); Brian G. Moser, Jamestown, NC (US); Michael Meeder, Jamestown, NC (US); Venkata Chivukula, Durham, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/194,005

(22) Filed: Jun. 27, 2016

(65) Prior Publication Data

US 2017/0103976 A1    Apr. 13, 2017

Related U.S. Application Data

(60) Provisional application No. 62/238,509, filed on Oct. 7, 2015.

(51) Int. Cl.
*H01L 27/02* (2006.01)
*H01L 29/872* (2006.01)
(Continued)

(52) U.S. Cl.
CPC .......... *H01L 27/0248* (2013.01); *H01L 23/66* (2013.01); *H01L 27/0605* (2013.01);
(Continued)

(58) Field of Classification Search
CPC ..... H01L 2223/6683; H01L 2223/6655; H01L 27/0605
See application file for complete search history.

(56) References Cited

U.S. PATENT DOCUMENTS

2005/0269658 A1* 12/2005 Ku .................. H01L 29/872
                                                    257/471
2015/0311193 A1* 10/2015 Laine .............. H01L 27/0259
                                                    257/491

OTHER PUBLICATIONS

Grant, R. W. et al., "OHMIC Contacts to Gallium Aluminum Arsenide for High Temperature Applications," Technical Report 88-1249, Rockwell International Science Center, Nov. 1988, 68 pages.

(Continued)

*Primary Examiner* — Dung Le
(74) *Attorney, Agent, or Firm* — Withrow & Terranova, P.L.L.C.

(57) ABSTRACT

Electrostatic Discharge (ESD) protection using lateral surface Schottky diodes is disclosed. In one embodiment, a Metal-Insulator-Metal (MIM) capacitor with ESD protection comprises a group III-V substrate, a first metal layer contacting the substrate, an insulation layer formed over the first metal layer, and a second metal layer formed over the insulation layer and also contacting the substrate. A MIM capacitor is formed by overlapping portions of the first metal layer, the insulation layer, and the second metal layer. First and second Schottky diodes are formed where the first and second metal layers, respectively, contact the substrate, such that the cathodes of the Schottky diodes are electrically connected to one another and the anodes of the Schottky diodes are electrically connected to the respective overlapping portions of the first and second metal layers.

20 Claims, 11 Drawing Sheets

(51) Int. Cl.
  *H01L 29/20*  (2006.01)
  *H01L 29/16*  (2006.01)
  *H01L 27/06*  (2006.01)
  *H01L 23/66*  (2006.01)
  *H01L 49/02*  (2006.01)

(52) U.S. Cl.
  CPC .......... *H01L 27/0676* (2013.01); *H01L 28/60* (2013.01); *H01L 29/16* (2013.01); *H01L 29/20* (2013.01); *H01L 29/2003* (2013.01); *H01L 29/872* (2013.01); *H01L 2223/6655* (2013.01); *H01L 2223/6672* (2013.01); *H01L 2223/6683* (2013.01)

(56) References Cited

OTHER PUBLICATIONS

Lepkowski, Jim, "AND8230/D: Application Hints for Transient Voltage Suppression Diode Circuits," Semiconductor Components Industries, LLC, Revision 1, Oct. 2009, 7 pages.
Tiku, Shiban, "Device Processing in III_V Manufacturing," PowerPoint presentation, CS MANTECH, May 20, 2010, 60 pages.
Wang, Z. et al., "Strategies to Cope with Plasma Charging Damage in Design and Layout Phases," 2005 IEEE International Conference on Integrated Circuit and Technology, May 9-11, 2005, IEEE, pp. 91-98.

* cited by examiner

ELECTROSTATIC DISCHARGE (ESD) PROTECTION OF CAPACITORS USING LATERAL SURFACE SCHOTTKY DIODES

RELATED APPLICATIONS

This application claims the benefit of provisional patent application Ser. No. 62/238,509, filed Oct. 7, 2015, the disclosure of which is hereby incorporated herein by reference in its entirety.

FIELD OF THE DISCLOSURE

The subject matter described herein relates to wafer fabrication processes. More specifically, it relates to structures that provide Electrostatic Discharge (ESD) protection of Metal-Insulator-Metal (MIM) capacitors or other components.

BACKGROUND

FIG. 1 is a wafer process cross section of a conventional Metal-Insulator-Metal (MIM) capacitor. In the example illustrated in FIG. 1, which is not to scale, above a substrate 10 there is an insulation or passivation layer 12, a bottom metal layer 14, dielectric layer 16, a top metal layer 18, an insulation layer 20, and a top passivation layer 22. The top metal layer 18, dielectric layer 16, and bottom metal layer 14 form the MIM capacitor C, which is graphically represented by the capacitor symbol. The insulation layer 12 electrically isolates the MIM capacitor C from the substrate 10, and the insulation layer 20 and passivation layer 22 electrically isolate the MIM capacitor C from structures above the MIM capacitor C. For clarity, the cross section illustrated in FIG. 1 shows only a portion of the MIM capacitor C; not shown in FIG. 1 are the electrical connections to the top metal layer 18 and bottom metal layer 14.

MIM capacitors that are connected to extrinsic pins, wire-bonding pads, or other external connections are susceptible to Electrostatic Discharge (ESD) damage, especially for Integrated Passive Components (IPCs) without intentionally fabricated active devices to form protection circuits. An ESD surge to top metal layer 18, for example, could cause a spark from the top metal layer 18 to the bottom metal layer 14, damaging the dielectric layer 16. This susceptibility can limit the ESD robustness of Monolithic Microwave Integrated Circuit (MMIC) chips, including those fabricated on a group III-V ("three-five") type substrate, such as Gallium Arsenide (GaAs).

Conventional approaches to providing ESD protection involve the use of reversed-biased P-type semiconductor/N-type semiconductor (PN) junction diodes from the external connection to power and/or ground. However, creation of a PN junction diode involves an implantation step, e.g., to create one or two doped regions within the substrate, but a typical GaAs wafer process may not have an implant step, and thus using a conventional ESD protection method increases the cost of the wafer process by including at least one implant step, which requires additional masks, lithography, and/or etching steps. An alternative way to introduce PN junction diodes on GaAs for ESD protection is to grow p-type and n-type doped layers on the GaAs substrate. However, this method also shares the disadvantage of added cost introduced to the initial GaAs starting material.

SUMMARY

Metal-Insulator-Metal (MIM) capacitors that are connected to extrinsic pins, wire-bonding pads, or other external connections are susceptible to Electrostatic Discharge (ESD) damage. On Gallium Arsenide (GaAs), metals contacting the surface typically form Schottky diodes, and placing back-to-back Schottky diodes can help raise the ESD failure threshold for MIM capacitors. The present disclosure relates to simple, space-efficient structures that provide ESD protection to MIM capacitors and/or other devices in semiconductor processes, especially for Integrated Passive Component (IPC) devices.

According to one aspect, a MIM capacitor with ESD protection using lateral surface Schottky diodes is provided. The capacitor comprises a group III-V ("three-five") substrate, a first metal layer formed over a first portion of the substrate, an insulation layer formed over the first metal layer, and a second metal layer disposed over a first portion of the insulation layer and over a second portion of the substrate. A junction between the first portion of the substrate and at least one of the first metal layer and a metal structure directly coupled to the first metal layer forms a junction of a first Schottky diode. A junction between the second portion of the substrate and at least one of the second metal layer and a metal structure directly coupled to the second metal layer forms a junction of a second Schottky diode. The MIM capacitor is formed by overlapping portions of the first metal layer, the insulation layer, and the second metal layer such that the cathodes of the first and second Schottky diodes are electrically connected to one another and the anodes of the first and second Schottky diodes are electrically connected to the respective overlapping portions of the first and second metal layers.

In one embodiment, the junction of the first Schottky diode is formed by the junction of the first portion of the substrate and the first metal layer and the junction of the second Schottky diode is formed by the junction of the second portion of the substrate and the second metal layer.

In one embodiment, the junction of the first Schottky diode is formed by the junction of the first portion of the substrate and the junction of the second Schottky diode is formed by the junction of the second portion of the substrate and a metal structure directly coupled to the second metal layer.

In one embodiment, the metal structure directly coupled to the second metal layer comprises at least one additional metal layer electrically connected in series between the second metal layer and the substrate.

In one embodiment, the junction of the first Schottky diode is formed by the junction of the first portion of the substrate and a metal structure directly coupled to the first metal layer and the junction of the second Schottky diode is formed by the junction of the second portion of the substrate and the second metal layer.

In one embodiment, the metal structure directly coupled to the first metal layer comprises at least one additional metal layer electrically connected in series between the first metal layer and the substrate.

In one embodiment, the junction of the first Schottky diode is formed by the junction of the first portion of the substrate and a first metal structure directly coupled to the first metal layer and the junction of the second Schottky diode is formed by the junction of the second portion of the substrate and a second metal structure directly coupled to the second metal layer.

In one embodiment, at least one of the first and second metal structures comprises at least one additional metal layer electrically connected in series between the respective metal layer and the substrate.

In one embodiment, the substrate comprises GaAs. In one embodiment, the substrate comprises semi-Insulating GaAs. Other substrates, such as Indium Phosphide (InP), Gallium Nitride (GaN), Aluminum Gallium Nitride (AlGaN), Gallium Phosphide (GaP), Boron Phosphide (BP), and Germanium (Ge) may be used. In one embodiment, the substrate is un-doped. In one embodiment, the substrate is N-doped. In one embodiment, the substrate resistivity is greater than 5E7 ohm-cm.

In one embodiment, at least one of the first metal layer and the second metal layer is electrically connected to an external pin, pad, or electrical contact.

In one embodiment, at least one of the first and second metal layers comprises at least one of Gold (Au), Germanium (Ge), Nickel (Ni), Aluminum (Al), Copper (Cu), Silver (Ag), Chromium (Cr), Hafnium (Hf), Nickel Chromium (NiCr), Tantalum Nitride (TaN), Titanium Tungsten (TiW), Tungsten Silicide (WSi), Platinum (Pt), Palladium (Pd), Neodymium (Nd), Magnesium (Mg), Molybdenum (Mo), and Titanium (Ti).

In one embodiment, the insulation layer comprises a dielectric layer. In one embodiment, the insulation layer comprises at least one of Silicon Oxide (SiOx), Silicon Nitride ($Si_3N_4$), Silicon Oxynitride (SiON), Aluminum Oxide ($Al_2O_3$), Strontium Titanium Oxide ($SrTiO_3$), Tantalum Pentoxide ($TaO_5$), Hafnium Oxide ($HfO_2$), and other dielectrics commonly used in the semiconductor industry.

In one embodiment, the MIM capacitor further comprises a passivation layer disposed over the second metal layer. In one embodiment, the passivation layer comprises at least one of Silicon Oxide ($SiO_x$), Silicon Nitride ($Si_3N_4$) Silicon Oxynitride (SiON), Polyimide, Benzocyclobutene (BCB), and Polybenzoxazole (PBO). Aluminum Oxide ($Al_2O_3$) and Strontium Titanium Oxide ($SrTiO_3$) are other possible layers.

According to another aspect, an ESD protection structure for group III-V semiconductor devices is provided. In one embodiment, the structure comprises a group III-V substrate, a first metal layer formed over a first portion of the substrate, and a second metal layer disposed over a first portion of the insulation layer and over a second portion of the substrate. A junction between the first portion of the substrate and at least one of the first metal layer and a metal structure directly coupled to the first metal layer forms a junction of a first Schottky diode. A junction between the second portion of the substrate and at least one of the second metal layer and a metal structure directly coupled to the second metal layer forms a junction of a second Schottky diode. The cathodes of the first and second Schottky diodes are electrically connected to one another and the anodes of the first and second Schottky diodes are electrically connected to first and second terminals, respectively, of an electrical device constructed on the group III-V substrate.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure, where like numbers indicate like elements.

DETAILED DESCRIPTION

Figure 1:
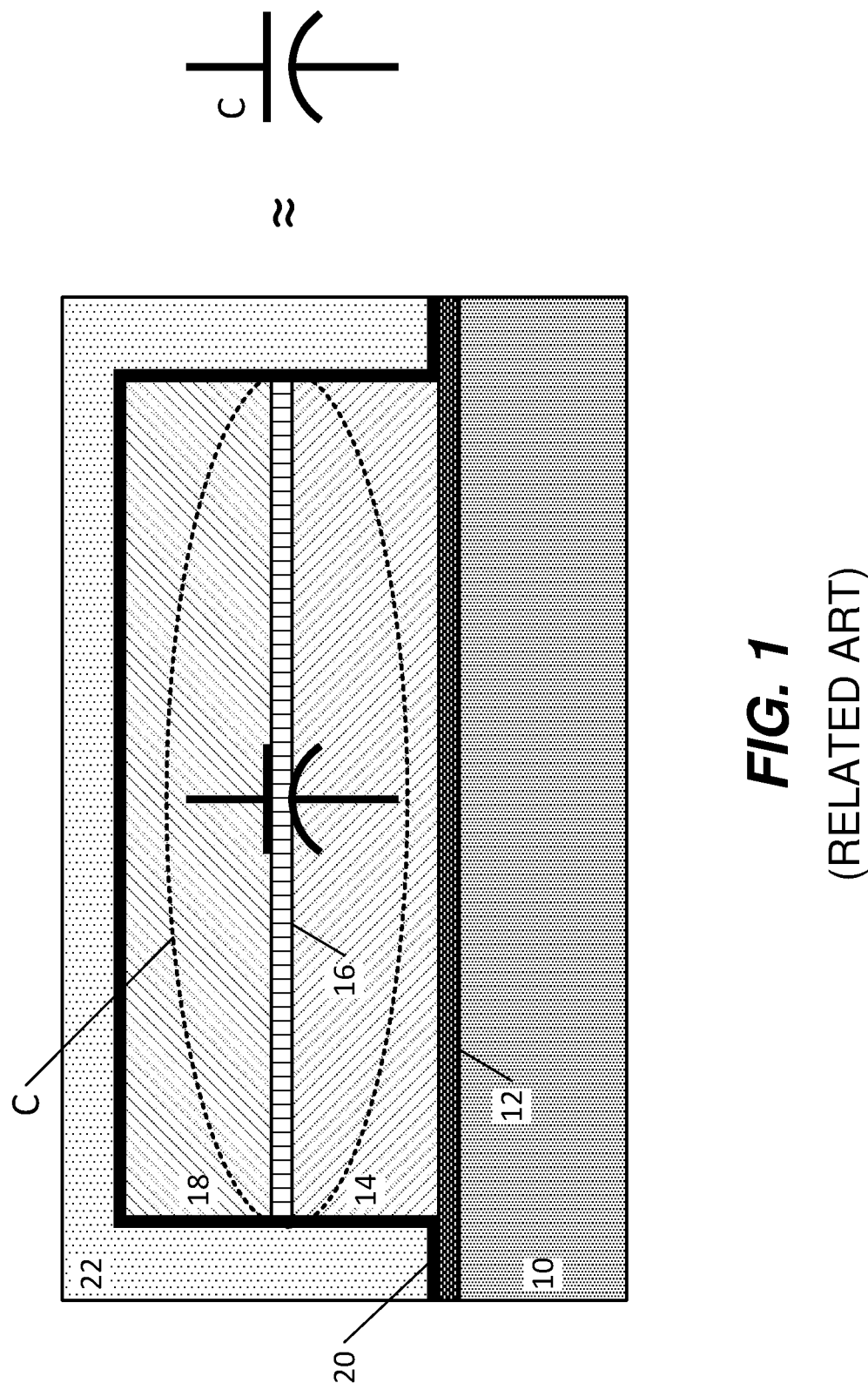
FIG. 1 is a wafer process cross section of a conventional Metal-Insulator-Metal (MIM) capacitor.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It should be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It should also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that, although the terms "upper," "lower," "bottom," "intermediate," "middle," "top," and the like may be used herein to describe various elements, these elements should not be limited by these terms. These terms are only used to distinguish one element from another. For example, a first element could be termed an "upper" element and, similarly, a second element could be termed an "upper" element depending on the relative orientations of these elements, without departing from the scope of the present disclosure.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having meanings that are consistent with their meanings in the context of this specification and the relevant art and will not be interpreted in an idealized or overly formal sense unless expressly so defined herein.

Metal-Insulator-Metal (MIM) capacitors that are connected to extrinsic pins, wire-bonding pads, or other external connections are susceptible to Electrostatic Discharge (ESD) damage. On Gallium Arsenide (GaAs), metals contacting the surface typically form Schottky diodes, and placing back-to-back Schottky diodes can help raise the ESD failure threshold for MIM capacitors. The present disclosure relates to simple, space-efficient structures that provide MIM capacitors with ESD protection in semiconductor processes, especially for Integrated Passive Component (IPC) devices.

Figure 2:
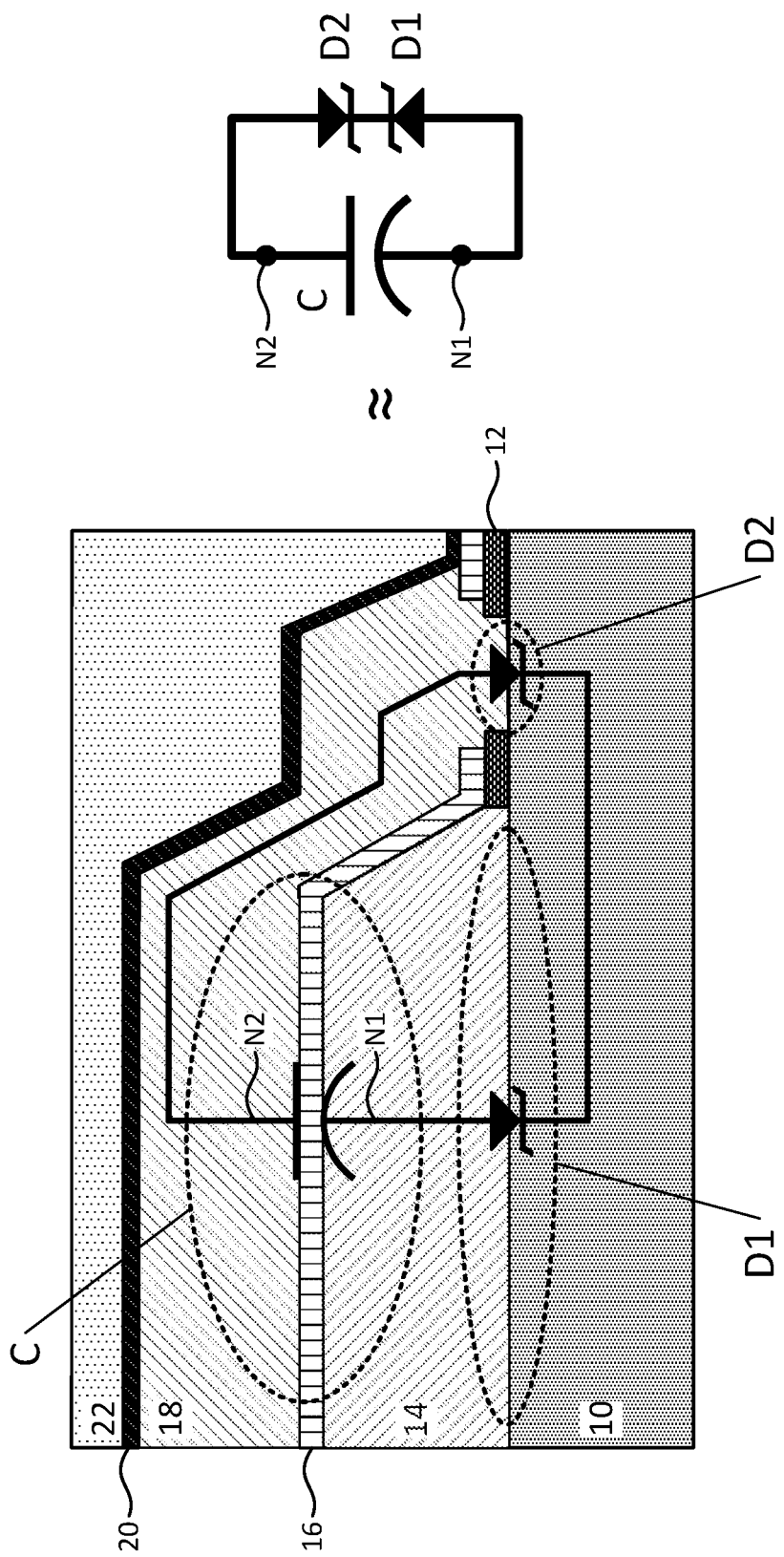
FIGS. 2 through 7 are wafer process cross sections of exemplary MIM capacitors having Electrostatic Discharge (ESD) protection according to embodiments of the subject matter described herein.

FIG. 2 is a wafer process cross section of an exemplary MIM capacitor having ESD protection according to an embodiment of the subject matter described herein. In the embodiment illustrated in FIG. 2, which is not to scale, a MIM capacitor C is constructed of the bottom metal layer 14 forming a first node N1 of the MIM capacitor, the dielectric layer 16, and the top metal layer 18 forming a second node N2 of the MIM capacitor C. In contrast to the MIM capacitor shown in FIG. 1, which includes the insulation layer 12 to electrically isolate the bottom plate of the MIM capacitor from the substrate, in FIG. 2, the insulation layer 12 is not present between the bottom metal layer 14 and the substrate 10 (although it is present in other locations). This allows the bottom metal layer 14 to contact the GaAs substrate 10 directly. This bottom metal-substrate connection forms a first Schottky diode D1 between the bottom metal layer 14 and the substrate 10. In addition, on the right side of FIG. 2, the top metal layer 18 extends past the bottom metal layer 14 and dielectric layer 16 to directly contact the substrate 10. This top metal-substrate connection forms a second Schottky diode D2 between the top metal layer 18 and the substrate 10. In order to create this second Schottky diode D2, a through-hole or "via" must be made through both dielectric layer 16 and insulation layer 12.

The first Schottky diode D1 and the second Schottky diode D2 are electrically connected through the substrate 10. Typical GaAs substrates are not doped or only lightly doped. Counterintuitively, however, a conductive path exists between the two Schottky diodes D1 and D2 along the surface of the substrate 10, even for un-doped GaAs substrates, resulting in the equivalent circuit shown on the right side of FIG. 2, showing how the MIM capacitor C, the first Schottky diode D1, and the second Schottky diode D2 are electrically connected to each other. The substrate 10 need not be considered as (and commonly is not) system ground The cathode-to-cathode-connected pair of Schottky diodes D1 and D2 provide ESD protection for the MIM capacitor C by clipping the input signals to the MIM capacitor C. A large positive voltage spike to the top metal layer 18, for example, would be clamped to the forward turn-on voltage of the Schottky diode D2 plus the reverse breakdown voltage of the Schottky diode D1.

This approach has the advantage that the Schottky diodes D1 and D2 can be created without requiring an implant step. For wafer fabrication methods that start with a wafer having pre-built layers and that create devices by etching or ablating wafer layers to leave the desired structures and then adding metal to make the electrical connections between them, the Schottky diode protection circuit topology described herein can be easily accommodated within existing wafer fabrication process design rules. The Schottky diode protection structures described herein can also be fabricated using wafer fabrication methods that start with a bare substrate and add layers, as well.

A wafer process typically provides for multiple metal layers, multiple passivation/insulation layers, and multiple vias to connect metal to metal or metal to substrate through the passivation/insulation layers. As a result, a Schottky-protected MIM capacitor may be created in a variety of ways, even within the constraints of one set of wafer process fabrication design rules. The following figures, which are not to scale, illustrate alternative structures for a MIM capacitor with ESD protection according to embodiments of the subject matter described herein.

In the embodiment illustrated in FIGS. 3A, 3B, 4A, 4B, 5A, and 5B, which are not to scale, a generic wafer process will be used for the purposes of illustration and should not be considered limiting.

Figure 3A:
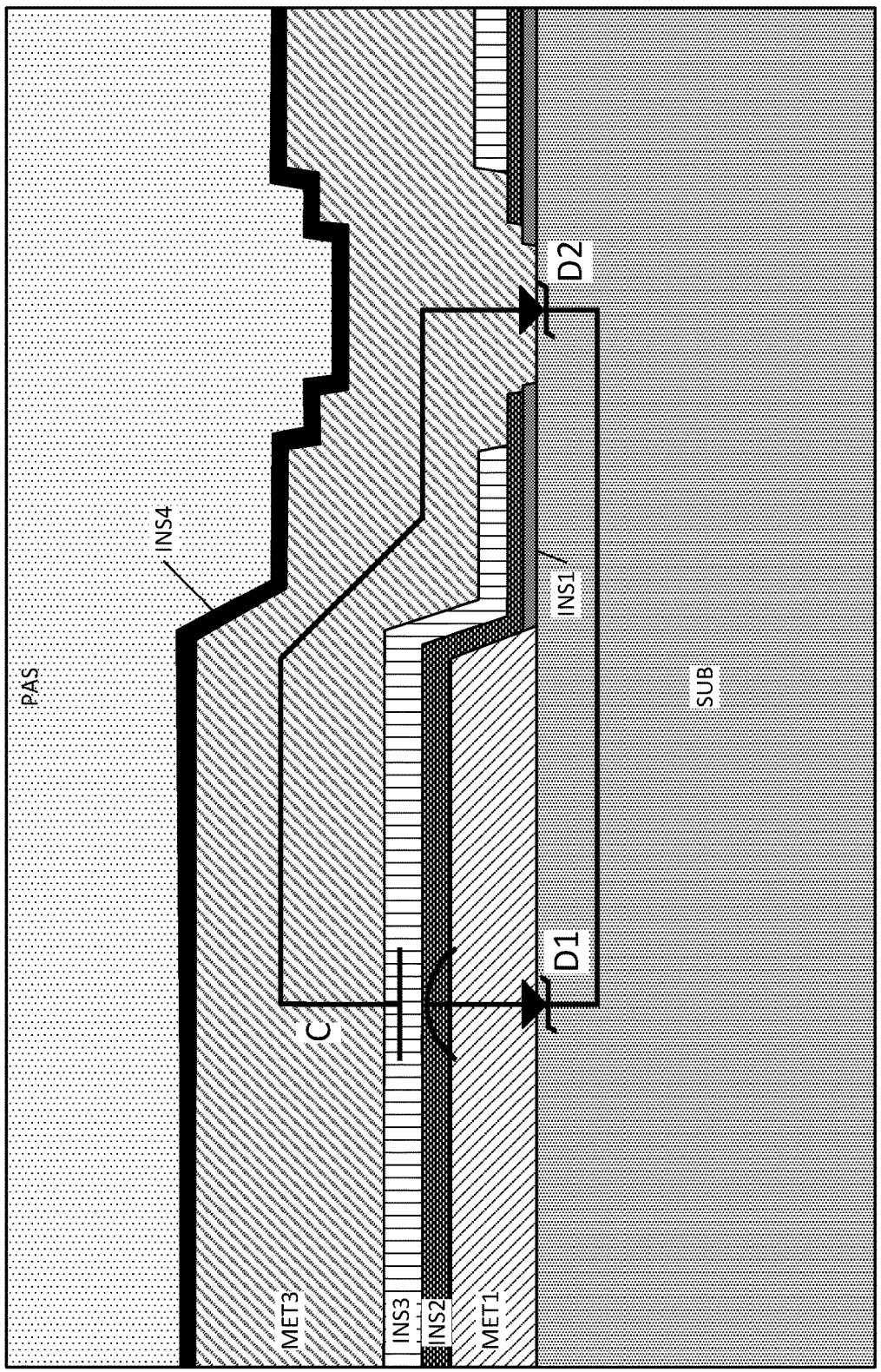

The generic wafer process shown in FIGS. 3A-5B includes the following layers, which exist (if present) in the following order from top to bottom:

PAS Passivation layer
INS4 Insulation layer 4
MET3 Metal 3
INS3 Insulation layer 3
MET2 Metal 2
INS2 Insulation layer 2
MET1 Metal 1
INS1 Insulation layer 1
MCON Contact metal
SUB Substrate FIG. 3A is a simulated wafer process cross section of an exemplary MIM capacitor with ESD protection according to an embodiment of the subject matter described herein. In the embodiment illustrated in FIG. 3A, a capacitor C is formed from a structure comprising the layers MET3 (upper plate), INS3 and INS2 (insulator), and MET1 (lower plate). A first Schottky diode D1 is formed at the junction of MET1 and SUB. A second Schottky diode D2 is formed at the junction of MET3 and SUB and is electrically connected to the upper plate of the MIM capacitor C by MET3. The Schottky diodes D1 and D2 are electrically connected through SUB. A top insulation layer INS4 covers MET3, and a passivation layer PAS covers the entire chip surface.

Figure 3B:
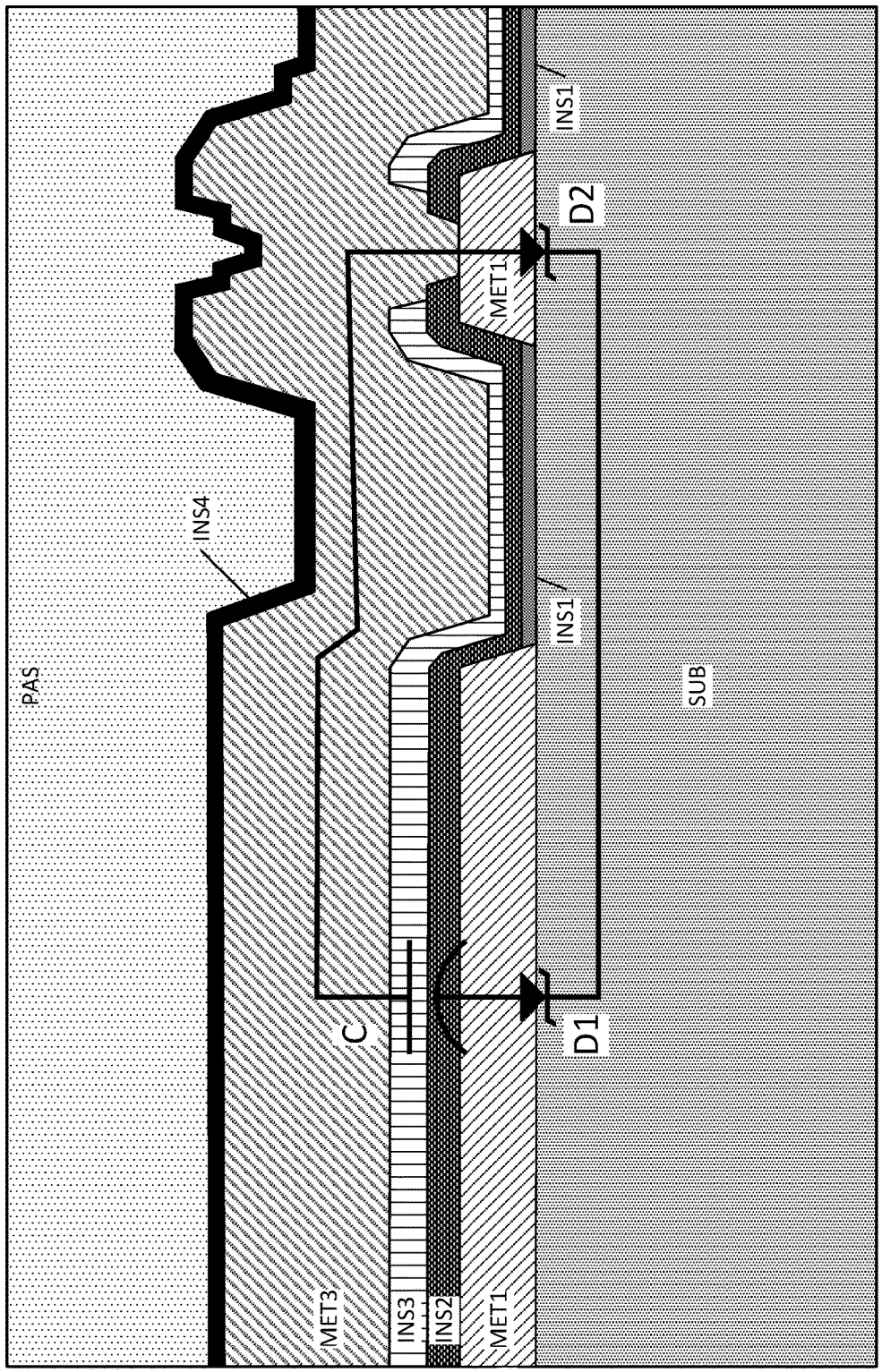

FIG. 3B is a simulated wafer process cross section of an exemplary MIM capacitor with ESD protection according to another embodiment of the subject matter described herein. The structure illustrated in FIG. 3B is almost identical to that shown in FIG. 3A, except that the Schottky diode D2 is formed at a junction of MET1 and SUB. MET1 is deposited above SUB, and a via through INS2 and INS3 allows MET3 to electrically connect with MET1 to provide the electrical connection between the top plate of the MIM capacitor C and the cathode of the Schottky diode D2.

Figure 4A:
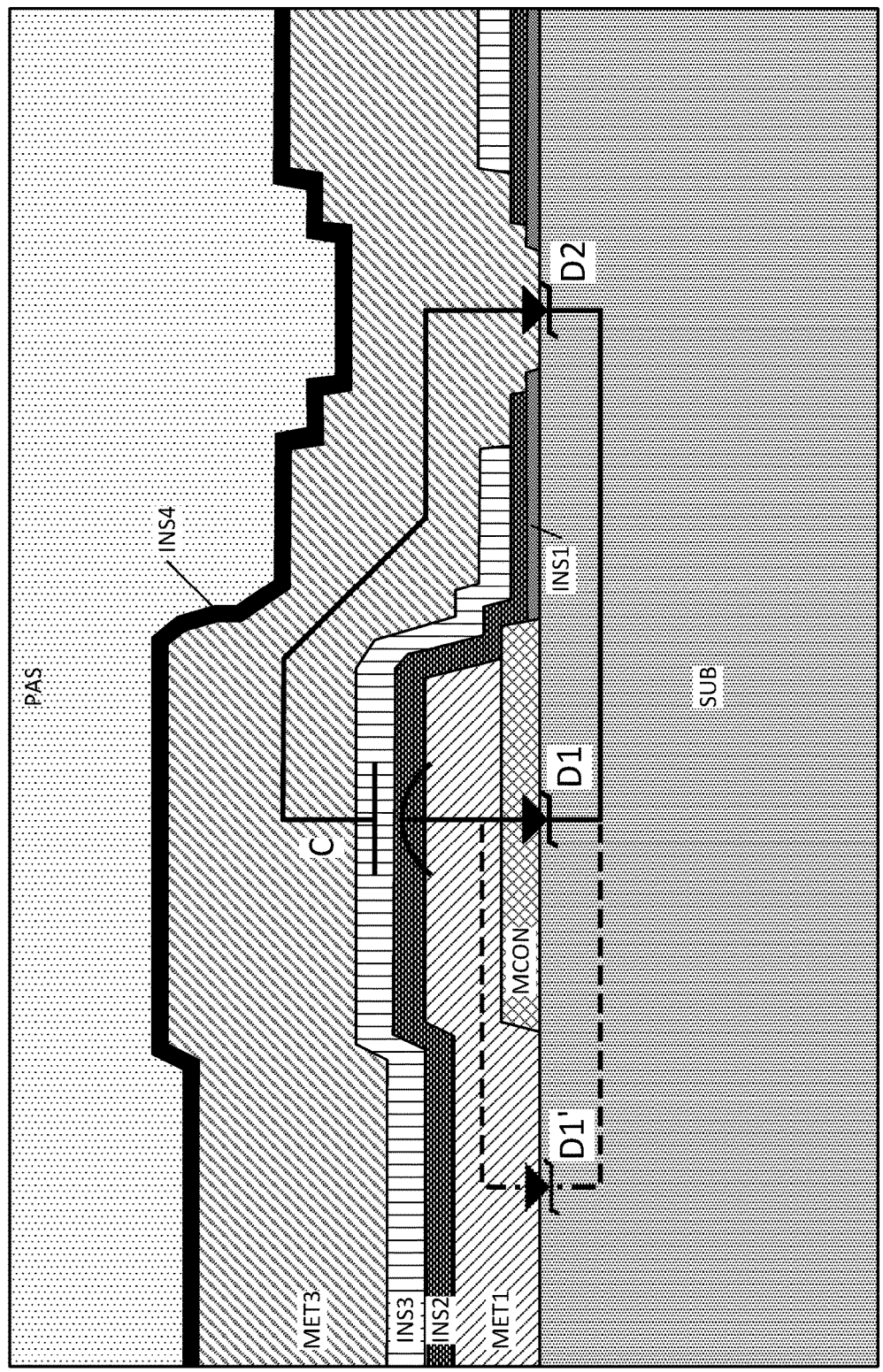

FIG. 4A is a simulated wafer process cross section of an exemplary MIM capacitor with ESD protection according to an embodiment of the subject matter described herein. In the embodiment illustrated in FIG. 4A, the MIM capacitor C is formed from a structure comprising the layers MET3 (upper plate), INS3 and INS2 (insulator), and MET1 (lower plate). The first Schottky diode D1 is formed at the junction of MCON and SUB and is electrically connected to the lower plate of the MIM capacitor C by the junction of MET1 and MCON. The second Schottky diode D2 is formed at the junction of MET3 and SUB and is electrically connected to the upper plate of the MIM capacitor C by MET3. The Schottky diodes D1 and D2 are electrically connected through SUB. A top insulation layer INS4 covers MET3, and a passivation layer PAS covers the entire chip surface.

Because the bottom plate of the MIM capacitor C (MET1) contacts SUB in more than one location, this contact may be modeled as multiple Schottky diodes connected in parallel. This is represented in FIG. 4A as the dashed lines to an additional Schottky diode, D1', to the left of the Schottky diode D1. In one embodiment, MCON may be a different material or have a different material characteristic compared to MET1. This may cause the diode D1' formed at the MET1-SUB junction to have different characteristics than diode D1 formed at MCON-SUB junctions, such as different barrier heights, turn-on voltages, etc., which may be exploited by the circuit designer.

Figure 4B:
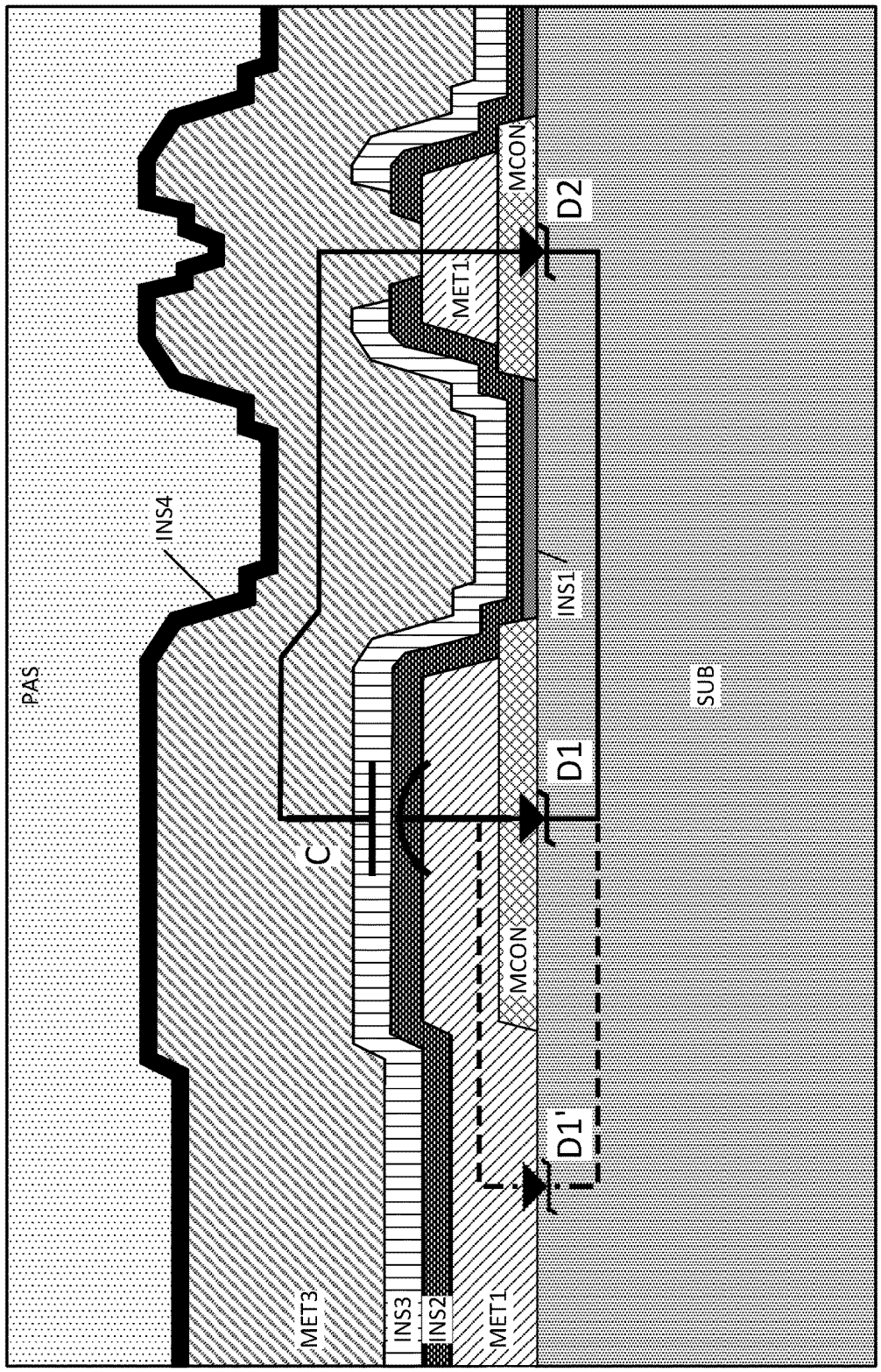

FIG. 4B is a simulated wafer process cross section of an exemplary MIM capacitor with ESD protection according to another embodiment of the subject matter described herein. The structure illustrated in FIG. 4B is almost identical to that shown in FIG. 4A, except that, like the first Schottky diode D1, the second Schottky diode D2 is formed at a junction of MCON and SUB. MET1 is deposited above MCON, and a via through INS2 and INS3 allows MET3 to electrically connect with MET1 to provide the electrical connection between the top plate of the MIM capacitor C and the cathode of the Schottky diode D2.

Figure 5A:
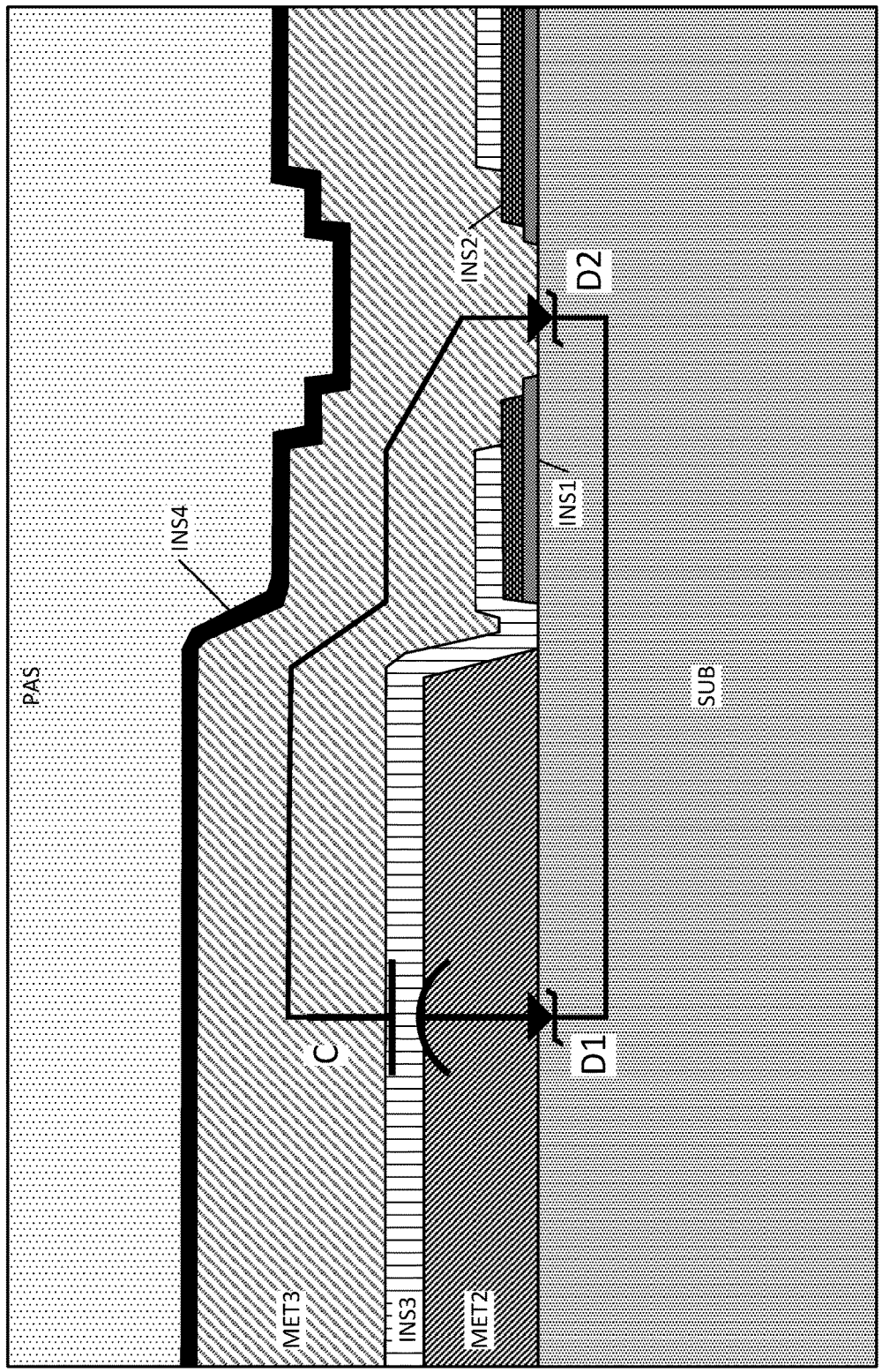

FIG. 5A is a simulated wafer process cross section of an exemplary MIM capacitor with ESD protection according to another embodiment of the subject matter described herein. The Schottky diode D2 structure and electrical contact is essentially identical to that shown in FIG. 4A, but in FIG. 5A, the MIM capacitor C is formed from a structure comprising the layers MET3 (upper plate), INS3 (insulator), and MET2 (lower plate), and D1 is formed at the junction of MET2 and SUB, rather than MET1 and SUB as in FIGS. 4A and 4B. Because INS1 and INS2 are deposited prior to deposition of MET2, it is necessary to prevent the deposition of INS1 and INS2 (or to remove deposited INS1 and INS2) in the area under the lower plate of the MIM capacitor C, so that the lower plate of the MIM capacitor C contacts SUB in order to form the Schottky diode D1.

Figure 5B:
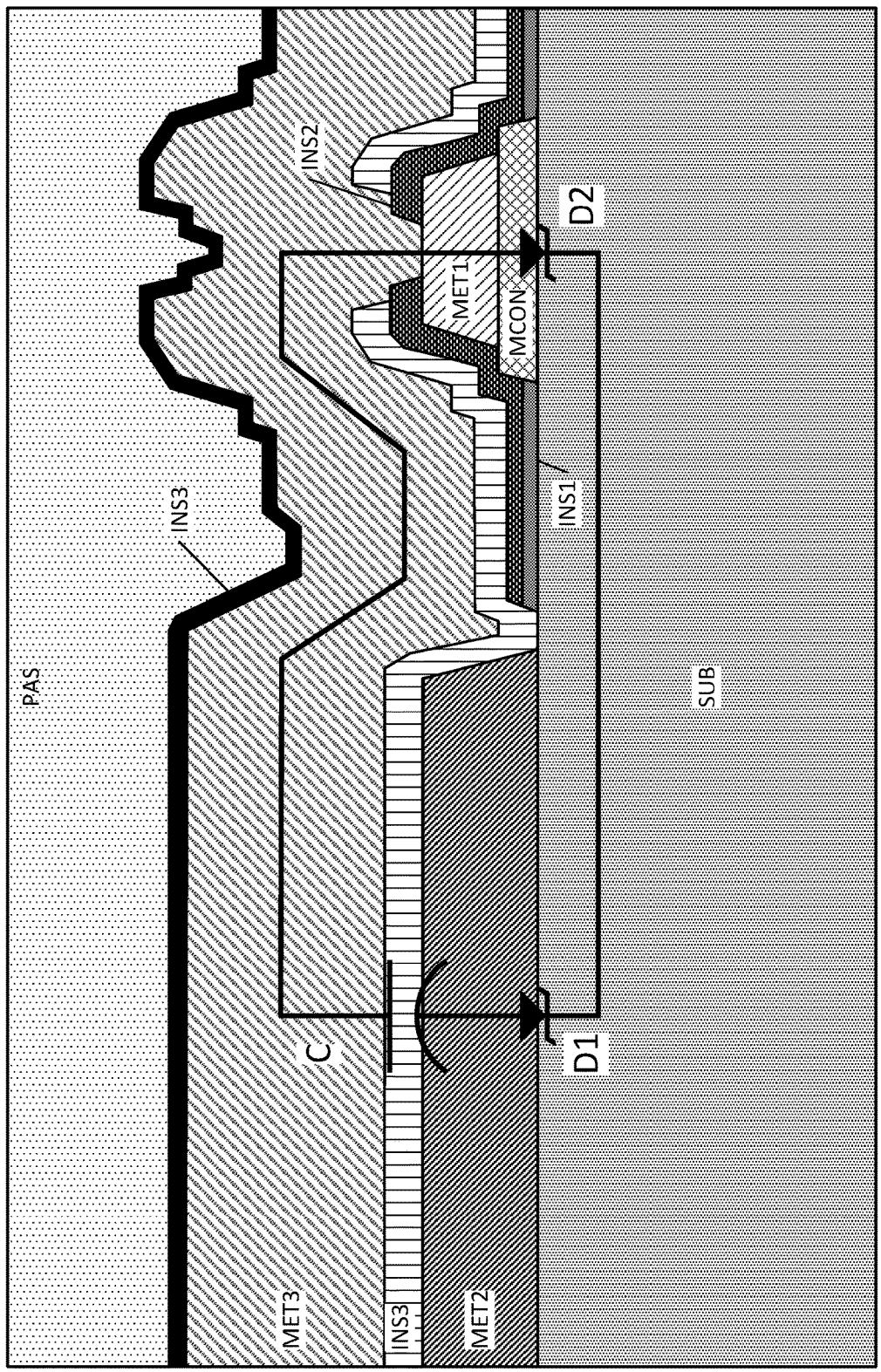

FIG. 5B is a simulated wafer process cross section of an exemplary MIM capacitor with ESD protection according to yet another embodiment of the subject matter described herein. The structure of the MIM capacitor C and the Schottky diode D1 are essentially identical to that shown in FIG. 5A, but in FIG. 5B, the top plate of the MIM capacitor C, which is comprised of MET3, is connected to the substrate via a metal structure comprising a MET1-MCON stack. The Schottky diode D2 is formed by the junction of MCON and SUB. In alternative embodiments, MET3 may be connected to SUB via a stack that may or may not include a MET2 layer, may or may not include a MET1 layer, and may or may not include a MCON layer.

It should be noted that the metal "stacks" comprising one or more metal layers (e.g., MET1, MET2, MET3, and MCON) are shown in FIGS. 3A-5B as being vertical stacks, i.e., one layer directly over and on top of another layer, arranged vertically so that all layers overlap with each other, but other configurations are contemplated. For example, the middle layer of the Schottky diode D2 stack in FIG. 5B, MET1, could be a long trace with one end above and electrically connected to a MCON layer and the other end below and electrically connected to a MET3 layer such that the MET3 and MCON layers do not overlap and may not be proximate to each other.

Figure 6:
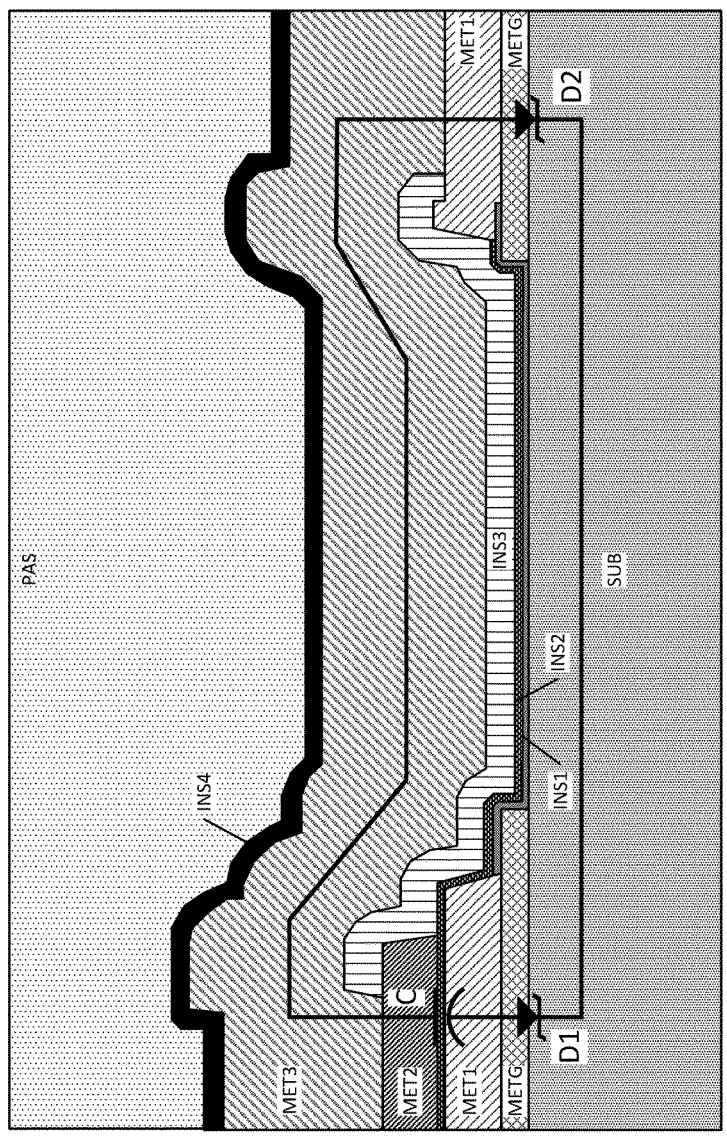

FIG. 6 is a simulated wafer process cross section of a Bipolar Junction Transistor (BJT)/Field Effect Transistor (FET) process, also referred to as a "Bi-FET process", having the following layers, which exist (if present) in the following order from top to bottom:

PAS Passivation layer
INS4 Insulation layer 4
MET3 Metal 3
INS3 Insulation layer 3
MET2 Metal 2
INS2 Insulation layer 2
MET1 Metal 1
INS1 Insulation layer 1
METG FET gate metal
SUB Substrate This Bi-FET process provides a number of metal and insulation layers, from which a MIM capacitor and Schottky diodes may be formed. In the embodiment illustrated in FIG. 6, which is not to scale, Schottky diodes D1 and D2 are respectively formed at the two METG-SUB junctions. The MIM capacitor C is formed from a structure comprising the layers MET2 (upper plate), INS2 (insulator), and MET1 (lower plate). The anode of the Schottky diode D1 is electrically connected to the lower plate of the MIM capacitor C by the MET1-METG junction. The anode of the Schottky diode D2 is electrically connected to the upper plate of the MIM capacitor C by the metal structure formed by the MET3-MET1-METG structure.

Figure 7:
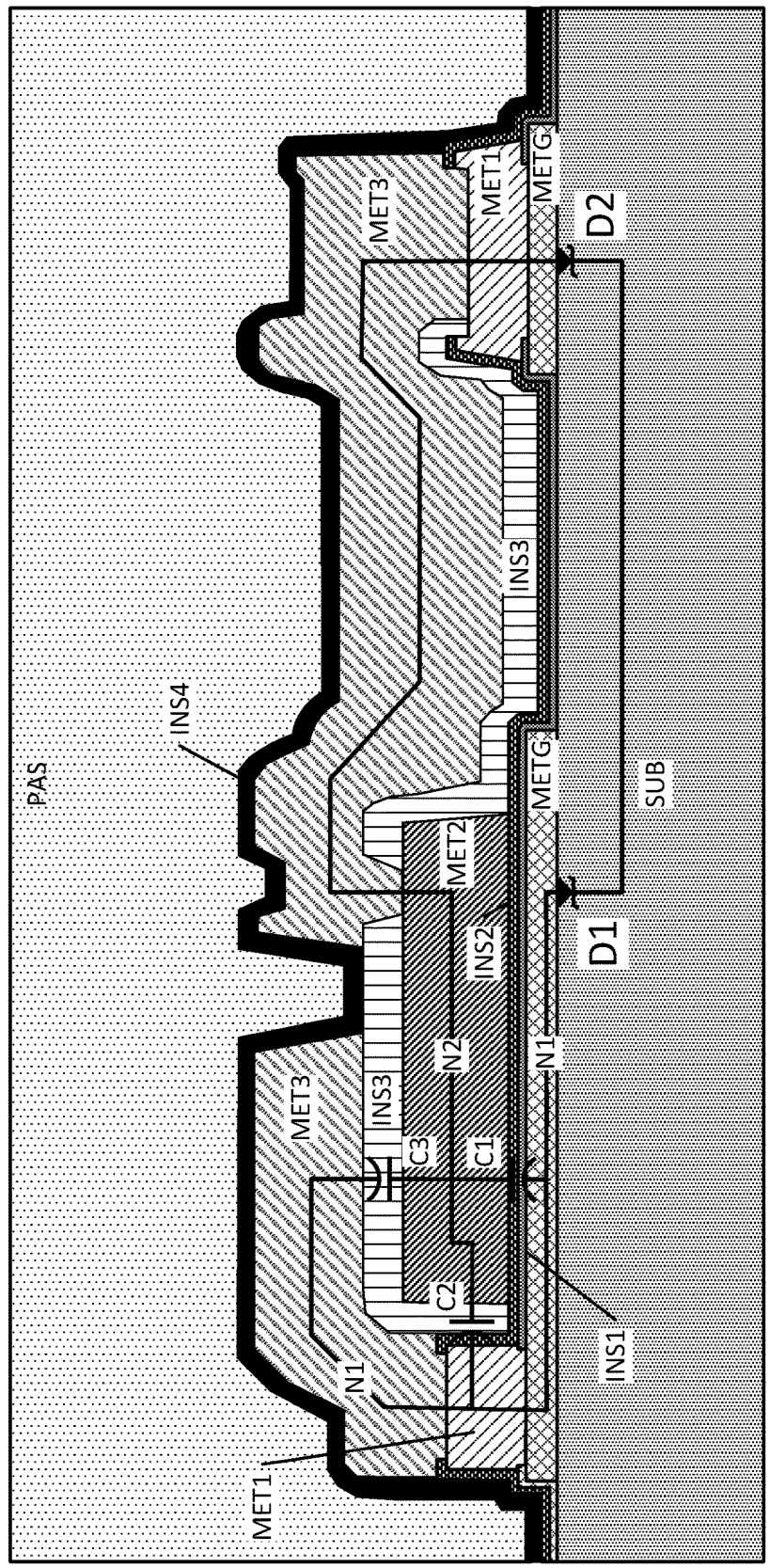

FIG. 7 is a simulated wafer process cross section of an exemplary MIM capacitor with ESD protection according to yet another embodiment of the subject matter described herein. In the embodiment illustrated in FIG. 7, which is not to scale, Schottky diodes D1 and D2 are respectively formed at the two METG-SUB junctions. A compound MIM capacitor is formed from distinct combinations of metal and insulation layers. In the embodiment illustrated in FIG. 7, one node of the capacitor is labeled N1 and the other node of the capacitor is labeled N2.

One portion of the capacitor, labeled "C1," is formed from the vertical stack comprised of layers MET2, INS2, INS1, and METG. Another portion of the capacitor, labeled "C2," is formed from the horizontal stack of layers MET2, INS3, INS2, and MET1. Yet another portion of the capacitor, labeled "C3," is formed from the vertical stack of layers MET2, INS3, and MET3. Node N2 is electrically connected to the anode of the Schottky diode D2 via the MET3 layer on the right side of FIG. 7. Node N1 is electrically connected to the anode of D1 via the METG layer on the left side of FIG. 7. The cathodes of the Schottky diodes D1 and D2 are electrically connected via SUB.

Figure 8:
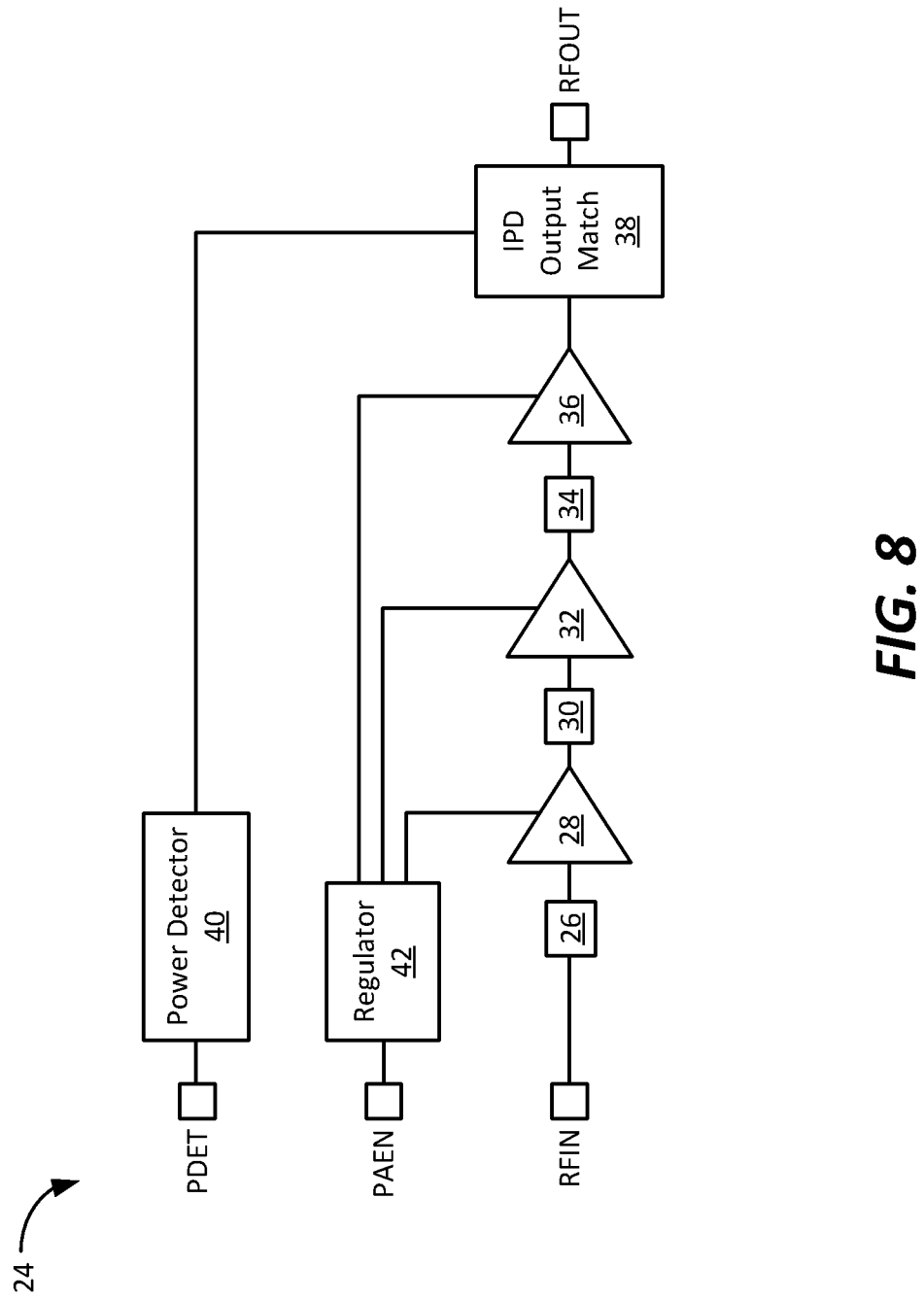
FIG. 8 is a block diagram illustrating an exemplary application of the MIM capacitor with ESD protection using lateral surface Schottky diodes according to an embodiment of the subject matter described herein.

FIG. 8 is a block diagram illustrating an exemplary application of the MIM capacitor with ESD protection using lateral surface Schottky diodes according to an embodiment of the subject matter described herein. In the embodiment illustrated in FIG. 8, a Radio Frequency (RF) amplifier circuit 24 accepts RF input via pin RFIN. The signal path from RFIN to RF output pin RFOUT includes a first matching circuit 26, a first amplifier 28, a second matching circuit 30, a second amplifier 32, a third matching circuit 34, a third amplifier 36, and an Integrated Passive Die (IPD) output matching circuit 38, which is connected to a power detector 40. A regulator 42 provides power to the amplifiers 28, 32, and 36. The output of the IPD output matching circuit 38 is provided directly to RFOUT. In the embodiment illustrated in FIG. 8, the IPD output matching circuit 38 will include at least one MIM capacitor C according to an embodiment described herein that will be connected directly to RFOUT. The lateral surface Schottky diodes D1 and D2 of the MIM capacitor C will provide ESD protection for the MIM capacitor C to protect it from an ESD surge coming from RFOUT.

The lateral surface Schottky diode protection circuit described herein may be used to protect any electrical component, not just capacitors, from ESD damage.

Those skilled in the art will recognize improvements and modifications to the preferred embodiments of the present disclosure. All such improvements and modifications are considered within the scope of the concepts disclosed herein and the claims that follow.

What is claimed is:

1. A Metal-Insulator-Metal (MIM) capacitor with Electrostatic Discharge (ESD) protection using lateral surface Schottky diodes, the capacitor comprising:
a group III-V substrate;
a first metal layer formed over a first portion of the substrate;
an insulation layer formed over the first metal layer;
a second metal layer disposed over a first portion of the insulation layer and over a second portion of the substrate;
wherein a junction between the first portion of the substrate and at least one of the first metal layer and a metal structure directly coupled to the first metal layer forms a junction of a first Schottky diode, a junction between the second portion of the substrate and at least one of the second metal layer and a metal structure directly coupled to the second metal layer forms a junction of a second Schottky diode, and the MIM capacitor is formed by overlapping portions of the first metal layer, the insulation layer, and the second metal layer such that cathodes of the first and second Schottky diodes are electrically connected to one another and anodes of the first and second Schottky diodes are electrically connected to the respective overlapping portions of the first and second metal layers.

2. The MIM capacitor of claim 1 wherein the junction of the first Schottky diode is formed by the junction of the first portion of the substrate and the first metal layer and the junction of the second Schottky diode is formed by the junction of the second portion of the substrate and the second metal layer.

3. The MIM capacitor of claim 1 wherein the junction of the first Schottky diode is formed by the junction of the first portion of the substrate and the junction of the second Schottky diode is formed by the junction of the second portion of the substrate and a metal structure directly coupled to the second metal layer.

4. The MIM capacitor of claim 3 wherein the metal structure directly coupled to the second metal layer comprises at least one additional metal layer electrically connected in series between the second metal layer and the substrate.

5. The MIM capacitor of claim 1 wherein the junction of the first Schottky diode is formed by the junction of the first portion of the substrate and a metal structure directly coupled to the first metal layer and the junction of the second Schottky diode is formed by the junction of the second portion of the substrate and the second metal layer.

6. The MIM capacitor of claim 5 wherein the metal structure directly coupled to the first metal layer comprises at least one additional metal layer electrically connected in series between the first metal layer and the substrate.

7. The MIM capacitor of claim 1 wherein the junction of the first Schottky diode is formed by the junction of the first portion of the substrate and a first metal structure directly coupled to the first metal layer and the junction of the second Schottky diode is formed by the junction of the second portion of the substrate and a second metal structure directly coupled to the second metal layer.

8. The MIM capacitor of claim 7 wherein at least one of the first and second metal structures comprises at least one additional metal layer electrically connected in series between the respective metal layer and the substrate.

9. The MIM capacitor of claim 1 comprising a second insulation layer formed over the second metal layer and a third metal layer disposed over a portion of the second insulation layer and making electrical contact with the first metal layer, wherein the MIM capacitor further comprises overlapping portions of the third metal layer, the second insulation layer, and the second metal layer.

10. The MIM capacitor of claim 1 wherein the substrate comprises at least one of Gallium Arsenide (GaAs) or semi-insulating GaAs.

11. The MIM capacitor of claim 1 wherein the substrate comprises at least one of Indium Phosphide (InP), Gallium Nitride (GaN), Aluminum Gallium Nitride (AlGaN), Gallium Phosphide (GaP), Boron Phosphide (BP), or Germanium (Ge).

12. The MIM capacitor of claim 1 wherein the substrate is un-doped.

13. The MIM capacitor of claim 1 wherein the substrate is N-doped.

14. The MIM capacitor of claim 13 wherein the substrate resistivity is greater than 5E7 ohm-cm.

15. The MIM capacitor of claim 1 wherein at least one of the first metal layer or the second metal layer is electrically connected to an external pin, pad, or electrical contact.

16. The MIM capacitor of claim 1 wherein at least one of the first or second metal layers comprises at least one of Gold (Au), Germanium (Ge), Nickel (Ni), Aluminum (Al), Copper (Cu), Silver (Ag), Chromium (Cr), Nickel Chromium (NiCr), Tantalum Nitride (TaN), Titanium Tungsten (TiW), Tungsten Silicide (WSi), Platinum (Pt), Palladium (Pd), Hafnium (Hf), Neodymium (Nd), Magnesium (Mg), or Titanium (Ti).

17. The MIM capacitor of claim 1 wherein the insulation layer comprises a dielectric layer.

18. The MIM capacitor of claim 17 wherein the insulation layer comprises at least one of Silicon Oxide ($SiO_X$), Silicon Nitride ($Si_3N_4$), Silicon Oxynitride (SiON), Aluminum Oxide ($Al_2O_3$), Strontium Titanium Oxide ($SrTiO_3$), Tantalum Pentoxide ($TaO_5$), or Hafnium Oxide ($HfO_2$).

19. The MIM capacitor of claim 1 further comprising a passivation layer disposed over the second metal layer, wherein the passivation layer comprises at least one of Silicon Oxide ($SiO_X$), Silicon Nitride ($Si_3N_4$), Silicon Oxynitride (SiON), Aluminum Oxide ($Al_2O_3$), Strontium Titanium Oxide ($SrTiO_3$), Polyimide, Benzocyclobutene (BCB), or Polybenzoxazole (PBO).

20. An Electrostatic Discharge (ESD) protection structure for group III-V semiconductor devices, the structure comprising:
a group III-V substrate;
a first metal layer formed over a first portion of the substrate;
an insulation layer formed over the first metal layer;
a second metal layer disposed over a first portion of the insulation layer and over a second portion of the substrate;
wherein a junction between the first portion of the substrate and at least one of the first metal layer or a metal structure directly coupled to the first metal layer forms a junction of a first Schottky diode, a junction between the second portion of the substrate and at least one of the second metal layer or a metal structure directly coupled to the second metal layer forms a junction of a second Schottky diode, such that cathodes of the first and second Schottky diodes are electrically connected to one another and anodes of the first and second Schottky diodes are electrically connected to first and second terminals, respectively, of an electrical device constructed on the group III-V substrate.

* * * * *